(12) United States Patent
Kim et al.

(10) Patent No.: US 8,242,565 B2
(45) Date of Patent: Aug. 14, 2012

(54) ELECTROSTATIC DISCHARGE PROTECTION DEVICE

(75) Inventors: Jang-Hoo Kim, Gyeonggi-do (KR); Ho-Woung Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 288 days.

(21) Appl. No.: 12/623,876

(22) Filed: Nov. 23, 2009

(65) Prior Publication Data

US 2010/0276755 A1 Nov. 4, 2010

(30) Foreign Application Priority Data

Apr. 30, 2009 (KR) .................. 10-2009-0038554

(51) Int. Cl.
*H01L 23/62* (2006.01)

(52) U.S. Cl. .............. 257/355; 438/289; 361/56

(58) Field of Classification Search .......... 257/355, 257/E21.135, E29.025; 438/289; 361/56
See application file for complete search history.

(56) References Cited

U.S. PATENT DOCUMENTS

| | | | |
|---|---|---|---|
| 7,488,617 B2* | 2/2009 | Han | 438/69 |
| 7,507,635 B2* | 3/2009 | Han | 438/435 |
| 2005/0088556 A1 | 4/2005 | Han | |
| 2010/0133583 A1* | 6/2010 | Mawatari et al. | 257/173 |

FOREIGN PATENT DOCUMENTS

| | | |
|---|---|---|
| KR | 1020030001915 | 1/2003 |
| KR | 1020040059759 | 7/2004 |
| KR | 1020050029455 | 3/2005 |
| KR | 1020100076554 | 7/2010 |

OTHER PUBLICATIONS

Notice of Allowance issued from Korean Intellectual Property Office on Nov. 30, 2010.

* cited by examiner

*Primary Examiner* — Phuc Dang
(74) *Attorney, Agent, or Firm* — IP & T Group LLP

(57) ABSTRACT

An electrostatic discharge protection device includes a substrate where an active region is defined by an isolation layer, a gate electrode simultaneously crossing both the isolation layer and the active region, and a junction region formed in the active region at both sides of the gate electrode and separated from the isolation layer by a certain distance in a direction where the gate electrode is extended. The electrostatic discharge protection device is able to prevent the increase of a leakage current while securing an electrostatic discharge protection property that a semiconductor device requires.

10 Claims, 13 Drawing Sheets

ELECTROSTATIC DISCHARGE PROTECTION DEVICE

CROSS-REFERENCE(S) TO RELATED APPLICATIONS

The present application claims priority of Korean Patent Application No. 10-2009-0038554, filed on Apr. 30, 2009, the disclosure of which is incorporated herein by reference in its entirety.

BACKGROUND OF THE INVENTION

The present invention relates to technology for fabricating a semiconductor device, and more particularly, to an electrostatic discharge protection device for protecting internal circuits from static electricity and a method for fabricating the same.

If a semiconductor integrated circuit (IC) is touched by a human body or a machine that is charged with electricity, static electricity charged in the human body or the machine is discharged to the inside of the semiconductor IC through external pins and pads of the IC, and thus internal circuits of the IC are seriously damaged by an excessive current having great energy. On the other hand, the internal circuits of the IC may be damaged as static electricity charged in the IC flows out through the human body or the machine when there is contact with the human body or the machine.

Therefore, most semiconductor integrated circuits include an electrostatic discharge protection device between a pad and an internal circuit as shown in FIG. 1 to protect major circuits from the damage due to the static electricity. In general, the electrostatic discharge protection device uses a transistor.

FIG. 2A illustrates a plane view of a conventional electrostatic discharge protection device. FIGS. 2B and 2C illustrate cross-sectional views taken along an X-X' line described in FIG. 2A in accordance with first and second prior arts, respectively. FIG. 3 illustrates a graph comparing leakage current properties of the electrostatic discharge protection devices in accordance with the first and second prior arts.

Referring to FIG. 2A, the conventional electrostatic discharge protection device includes an active region 11 defined by an isolation layer 12, a gate electrode 13 simultaneously crossing both of the active region 11 and the isolation layer 12, a junction region 16 formed in the active region 11 at both sides of the gate electrode 13, a first wire 14 connected to a pad unit and the junction region 16 at one side of the gate electrode 13, and a second wire 15 connected to a ground unit and the junction region 16 at the other side of the gate electrode 13.

However, as described in FIG. 2B, the electrostatic discharge protection device in accordance with the first prior art has a problem in that a contact area between the active region 11 and the junction region 16 is reduced and thus an electrostatic discharge protection property thereof is deteriorated as a degree of integration of a semiconductor device is increased.

As illustrated in FIG. 2C, the electrostatic discharge protection device in accordance with the second prior art that is introduced to solve the above problem includes the junction region 16 that is formed of a first junction part 16A and a second junction part 16B having a depth greater than that of the first junction part 16A in a direction where the gate electrode 13 is extended, i.e., an X-X' direction. Like this, the contact area between the active region 11 and the junction region 16 is increased by forming the junction region 16 to include the first and second junction parts 16A and 16B having different depths from each other, so that it is possible to improve the electrostatic discharge protection property.

However, since the junction region 16 is generally formed through an impurity ion implantation process, in the second prior art, impurities are piled up on a sidewall of the isolation layer 12 close to the junction region 16 in a process of forming the first and second junction parts 16A and 16B. Further, the piled-up impurities act as a source or path of a leakage current. Referring to FIG. 5B, the leakage current of the electrostatic discharge protection device is rapidly increased compared with the first prior art. In particular, as shown in FIG. 3, an amount of the leakage current generated in a state that a constant voltage, i.e., 2 V, is supplied to the junction region 16 is 2.99 nA in the first prior art and 22.7 nA in the second prior art. That is, it is noticed that the amount of the leakage current in the second prior art is sharply increased compared with that in the first prior art.

SUMMARY OF THE INVENTION

Some embodiments are directed to providing an electrostatic discharge protection device capable of preventing the increase of a leakage current as well as securing an electrostatic discharge protection property that a semiconductor device requires, and a method for fabricating the electrostatic discharge protection device.

Some embodiments are directed to an electrostatic discharge protection device, the device comprising a substrate where an active region is defined by an isolation layer, a gate electrode simultaneously crossing both the isolation layer and the active region, and a junction region formed in the active region at both sides of the gate electrode and separated from the isolation layer by a certain distance in a direction where the gate electrode is extended.

The junction region comprises first and second junction parts having different junction depths from each other.

The junction region comprises first and second junction parts, wherein the first junction part has a junction depth smaller than that of the second junction part, and is disposed at both sides of the second junction part and separated from the isolation layer by the certain distance in the direction where the gate electrode is extended.

The first and second junction parts have the same conductive type or conductive types complementary to each other. The first and second junction parts have the same conductive type, and the impurity doping concentration of the first junction part is smaller than that of the second junction part.

The device further comprises a well formed in the active region and including the first and second junction parts therein.

The first and second junction parts have the same conductive type, and the well has a conductive type complementary to that of the first and second junction parts.

The first and second junction parts have conductive types complementary to each other, and the well has the same conductive type as that of the first junction part.

Some embodiments are directed to a method for fabricating an electrostatic discharge protection device, the method comprising forming a gate electrode on a substrate, where an active region is defined by an isolation layer, so that the gate electrode crosses both the isolation layer and the active region, and forming a junction region, separated from the isolation layer by a certain distance in a direction where the gate electrode is extended, by selectively ion-implanting impurities into the active region.

Forming the junction region comprises ion-implanting the impurities in the direction where the gate electrode is extended using a mask pattern and the gate electrode as an ion implantation barrier, wherein the mask pattern partially covers the active region that is close to the isolation layer.

Forming the junction region comprises forming first and second junction parts having different junction depths from each other.

forming the junction region comprises: forming a mask pattern partially covering the active region that is close to the isolation layer in the direction where the gate electrode is extended; and forming the first and second junction parts by ion-implanting the impurities plural times using the mask pattern and the gate electrode as an ion implantation barrier, wherein a junction depth of the second junction part is greater than that of the first junction part.

The first junction part is formed through a tilt ion implantation method.

The first and second junction parts are formed to have the same conductive type or conductive types complementary to each other.

The first and second junction parts are formed to have the same conductive type, and impurity doping concentration of the first junction part is smaller than that of the second junction part.

The method further comprises forming a well in the active region before forming the gate electrode.

The first and second junction parts are formed to have the same conductive type, and the well is formed to have a conductive type complementary to that of the first and second junction parts. The first and second junction parts are formed to have conductive types complementary to each other, and the well is formed to have the same conductive type as that of the first junction part.

Some embodiments are directed to a method for fabricating an electrostatic discharge protection device, the method comprising forming an isolation layer in a substrate to define an active region, simultaneously forming a gate electrode and a dummy pattern over the substrate, wherein the gate electrode crosses both the isolation layer and the active region, and the dummy pattern crosses the gate electrode and partially covers the active region adjacent to the isolation layer, forming a first junction part by ion-implanting impurities into the active region using the gate electrode and the dummy pattern as an ion implantation barrier, forming a spacer at both sides of the dummy pattern and the gate electrode and forming a second junction part by ion-implanting impurities into the active region using the gate electrode, the dummy pattern, and the spacer as an ion implantation barrier.

The second junction part is formed to have a junction depth greater than that of the first junction part.

The first and second junction parts are formed to have the same conductive type or conductive types complementary to each other.

The first and second junction parts are formed to have the same conductive type, and impurity doping concentration of the first junction part is smaller than that of the second junction part.

The method further comprises forming a well in the active region before forming the gate electrode and the dummy pattern.

The first and second junction parts are formed to have the same conductive type, and the well is formed to have a conductive type complementary to that of the first and second junction parts.

The first and second junction parts are formed to have conductive types complementary to each other, and the well is formed to have the same conductive type as that of the first junction part.

DESCRIPTION OF SPECIFIC EMBODIMENTS

Figure 1:
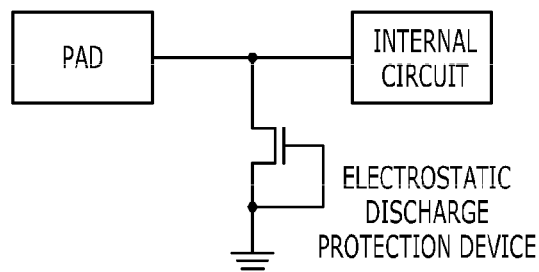
FIG. 1 illustrates a schematic circuit diagram of a typical electrostatic discharge protection circuit.
Figure 2A:
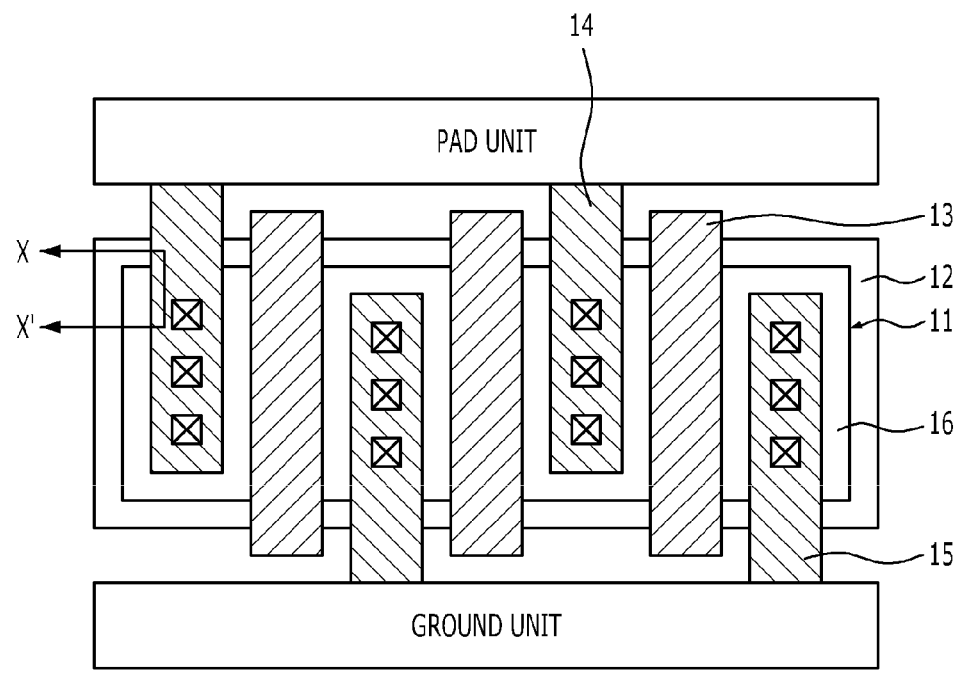
FIG. 2A illustrates a plane view of a conventional electrostatic discharge protection device.
Figure 2B:
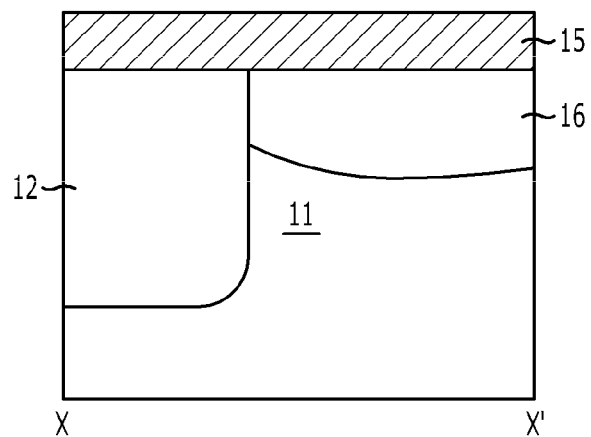
FIGS. 2B and 2C illustrate cross-sectional views of electrostatic discharge protection devices in accordance with first and second prior arts, respectively.
Figure 2C:
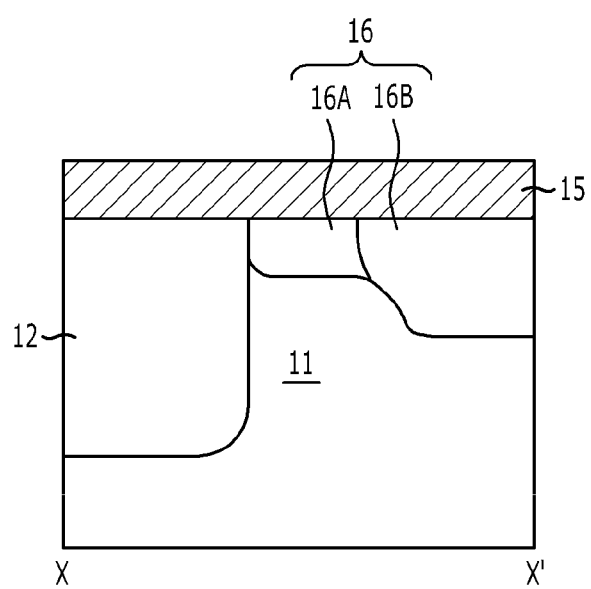
Figure 3:
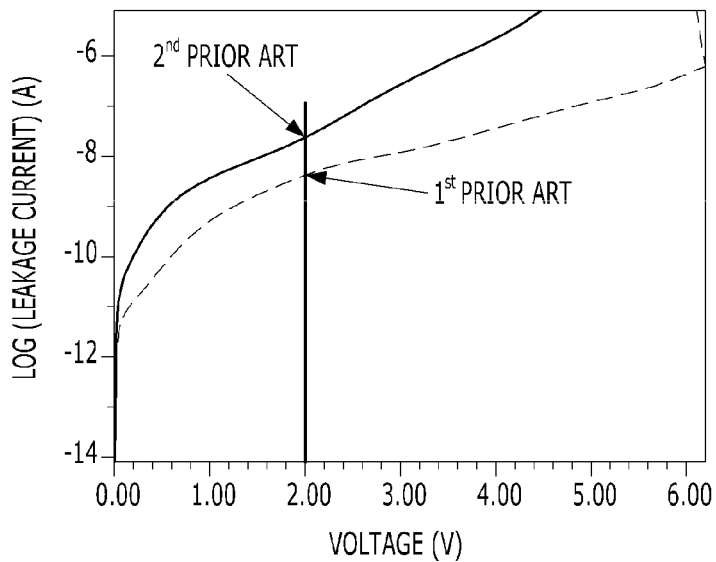
FIG. 3 illustrates a graph comparing leakage current properties of the electrostatic discharge protection devices in accordance with the first and second prior arts.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

Figure 4A:
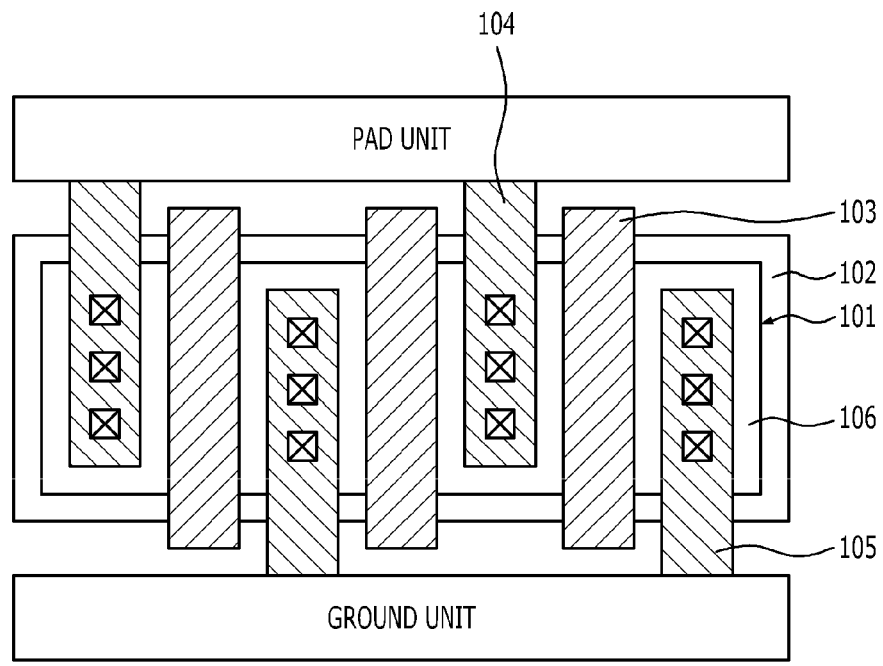
FIGS. 4A to 4C illustrate views of an electrostatic discharge protection device in accordance with a first embodiment of the present invention.
Figure 4B:
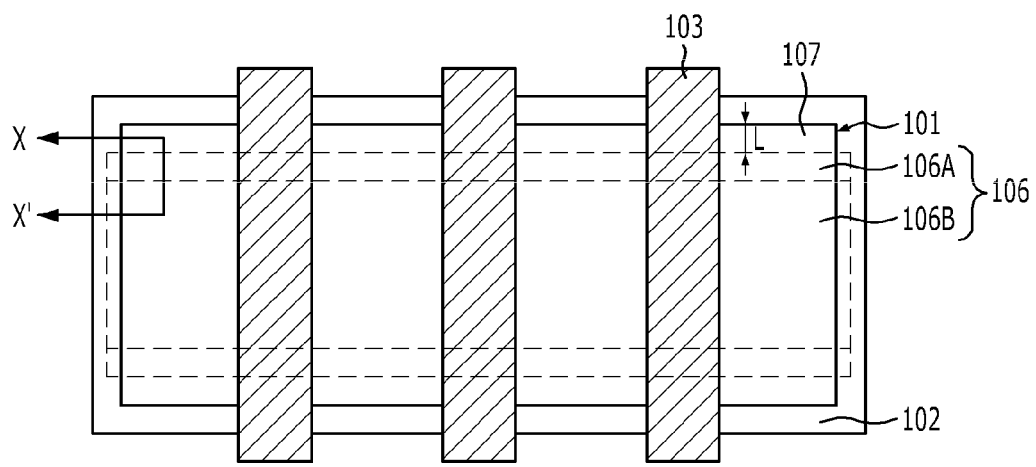
Figure 4C:
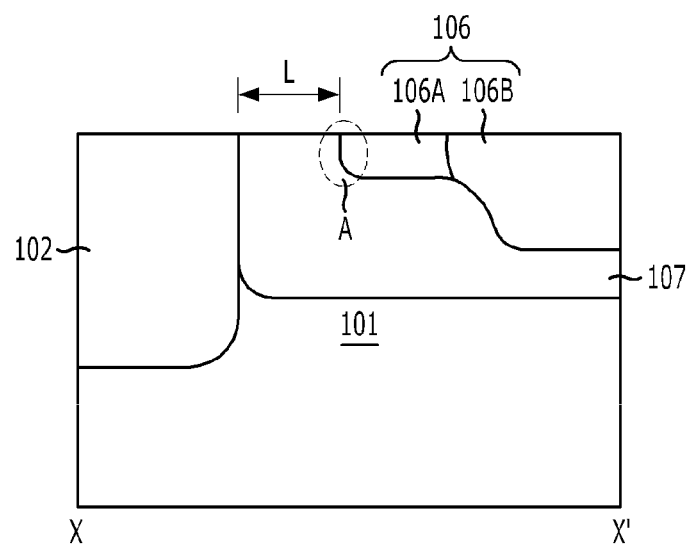

FIGS. 4A to 4C illustrate views of an electrostatic discharge protection device in accordance with a first embodiment of the present invention. Herein, FIG. 4A is a plane view of the electrostatic discharge protection device in accordance with the first embodiment; FIG. 43 is a plane view only showing a substrate where an isolation layer 102 and an active region 101 are defined and a gate electrode 103; and FIG. 4C is a cross-sectional view taken along an X-X' line illustrated in FIG. 4B.

Referring to FIGS. 4A to 4C, the electrostatic discharge protection device in accordance with the first embodiment includes a substrate 100 where the active region 101 is defined by an isolation layer 102 having a shallow trench isolation structure, a gate electrode 103 simultaneously crossing both the active region 101 and the isolation layer 102 and connected to a power supplying unit (not shown) or a ground unit, a junction region 106 formed in the active region 101 at both sides of the gate electrode 103, a first wire 104 connected to a pad unit and the junction region 106 at one side of the gate electrode 103 (e.g., a drain region), and a second wire 105 connected to the ground unit and the junction region 106 at the other side of the gate electrode 103 (e.g., a source region). The electrostatic discharge protection device may further include a well 107 formed in the active region 101 and the junction region 106 may be formed in the well 107.

The junction region 106 may include first and second junction parts 106A and 106B, respectively, having different junction depths from each other. In particular, the junction region 106 may include the second junction part 106B and the first junction part 106A, wherein the first junction part 106A has a junction depth smaller than that of the second junction part 106B and is disposed at both sides of the second junction part 106B. Further, the first junction part 106A and the isolation layer 102 are a certain distance L apart in a direction where the gate electrode 103 is extended, i.e., an X-X' direction. Herein, the second junction part 106B practically acts as the source region and the drain region, and the first junction part 106A plays a role of reducing a leakage current and adjusting an operating voltage of the electrostatic discharge protection device. Therefore, it is preferable that a width of the second junction part 106B is greater than that of the first junction part 106A in the direction where the gate electrode 103 is extended.

In accordance with the present invention, since the junction region 106 includes the first and second junction parts 106A and 106B, respectively, having different junction depths from each other, it is possible to secure the electrostatic discharge protection property that the highly integrated semiconductor device requires by increasing a contact area between the junction region 106 and the active region 101 (or the well 107). In addition, since a sidewall of the junction region 106 is adjacent to the active region 101 or the well 107 in the direction where the gate electrode 103 is extended, and the junction region 106 and the isolation layer 102 are the certain distance L apart, it is possible to further increase the contact area between the active region 101 and the junction region 106, referring to a reference numeral 'A' in FIG. 4C. Through this, the electrostatic discharge protection property that the semiconductor device requires may be more effectively secured.

In accordance with the present invention, since the junction region 106 and the isolation layer 102 are the certain distance L apart, it is possible to prevent impurities from being piled up on a sidewall of the isolation layer 102, as a result of an impurity ion implantation process for forming the junction region 106. Thus, it is possible to originally prevent the impurities piled up on the sidewall of the isolation layer 102 from acting as a leakage current source or path and to control the increase of the leakage current. Moreover, it is possible to control the defect generated on the sidewall of the isolation layer 102 when forming the isolation layer 102 from acting as the leakage current source or path by separating the junction region 106 and the isolation layer 102 by the certain distance L. Through this, the increase of the leakage current of the electrostatic discharge protection device may be effectively restrained. For reference, the defect generated on the sidewall of the isolation layer 102 (e.g., a vacancy, a dangling bond and so on), acts as a trap site to capture carriers, fluid impurities such as a metal ion, and so on. As a result, the defect acts as the leakage current source.

In accordance with an embodiment of the present invention, the first and second junction parts 106A and 106B constructing the junction region 106 may have conductive types complementary to each other to improve the electrostatic discharge protection property and the leakage current property of the electrostatic discharge protection device. In the case where the first and second junction parts 106A and 106B have the conductive types complementary to each other, the well 107 may have the same conductive type as that of the first junction part 106A. For instance, in case the second junction part 106B has an N type, the first junction part 106A and the well 107 are preferably formed with a P type. In case the second junction part 106B has the P type, it is preferable to form the first junction part 106A and the well 107 with the N type.

In accordance with another embodiment of the present invention, the first and second junction parts 106A and 106B constructing the junction region 106 may have the same conductive type to improve the electrostatic discharge protection property and the leakage current property of the electrostatic discharge protection device. In this case, it is preferable that impurity doping concentration of the first junction part 106A is smaller than that of the second junction part 106B. Moreover, in case the first and second junction parts 106A and 106B have the same conductive type, the well 107 may have a conductive type complementary to the first and second junction parts 106A and 106B. For instance, in case the first and second junction parts 106A and 106B have the N type, the well 107 may have the P type. In case the first and second junction parts 106A and 106B have the P type, the well 107 may have the N type.

As described above, it is possible to secure the electrostatic discharge protection property that the semiconductor device requires by employing the junction region 106 constructed of the first and second junction parts 106A and 106B having different junction depths from each other, and to prevent the increase of the leakage current of the electrostatic discharge protection device by separating the isolation layer 102 and the junction region 106 by the certain distance L. This will be known with reference to FIGS. 5A to 5D.

Figure 5A:
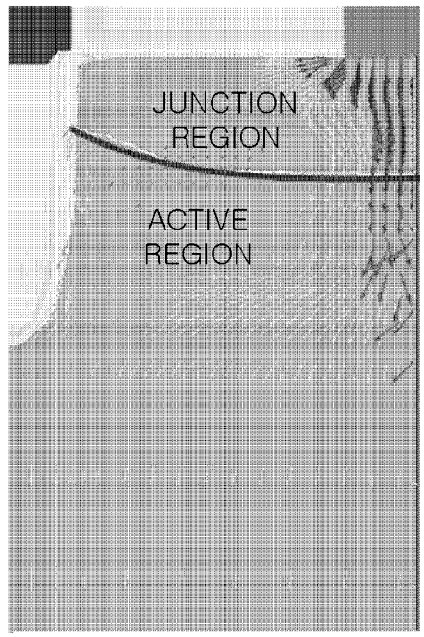
FIGS. 5A to 5C illustrate simulation images representing leakage current paths of the electrostatic discharge protection devices in accordance with the first and second prior arts and the electrostatic discharge protection device in accordance with the first embodiment of the present invention, respectively.
Figure 5B:
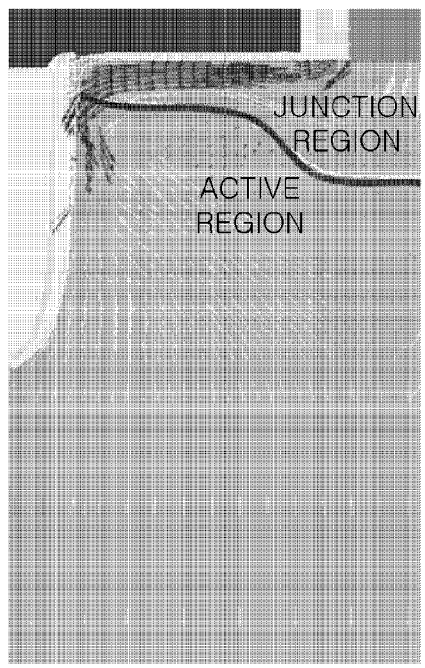
Figure 5C:
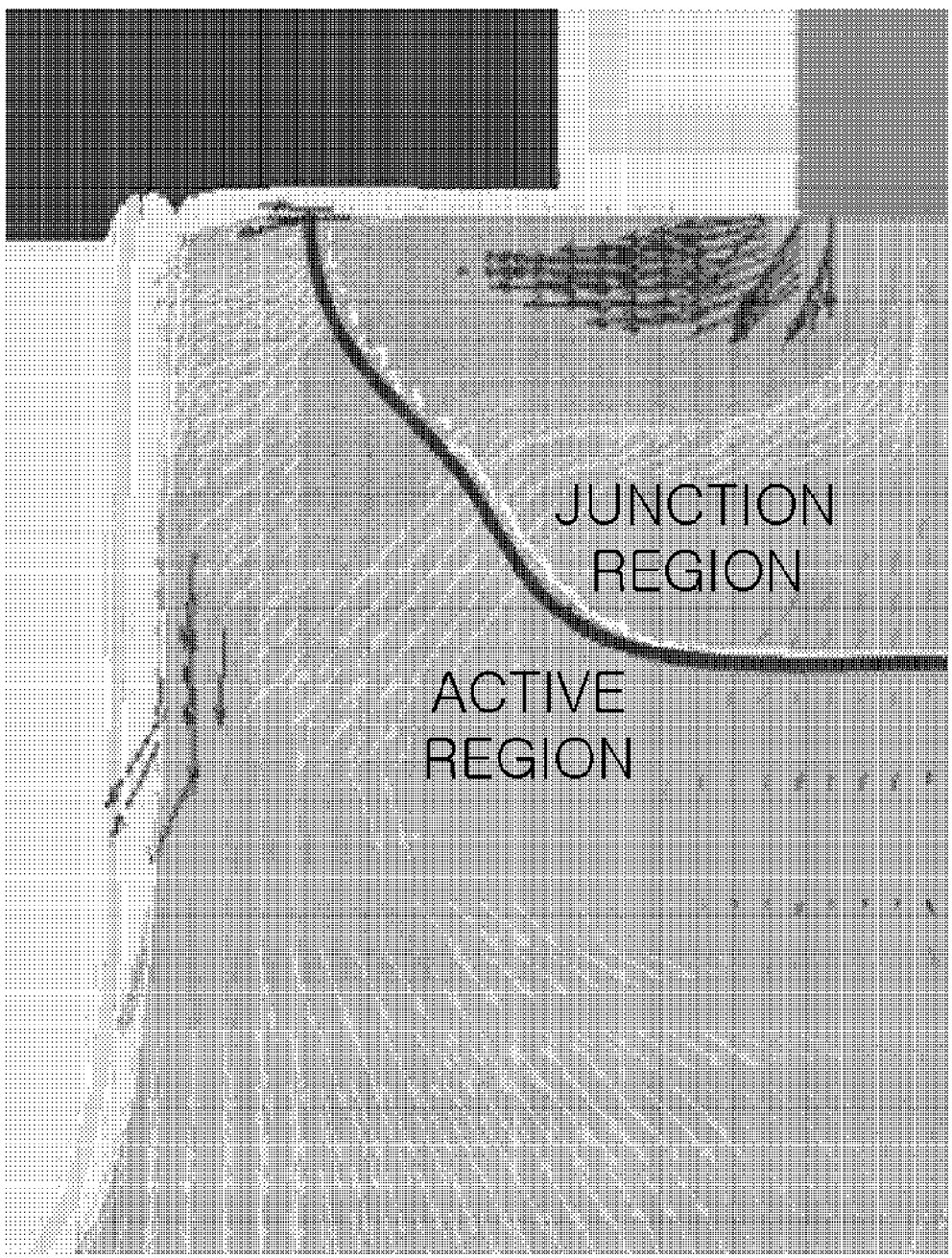
Figure 5D:
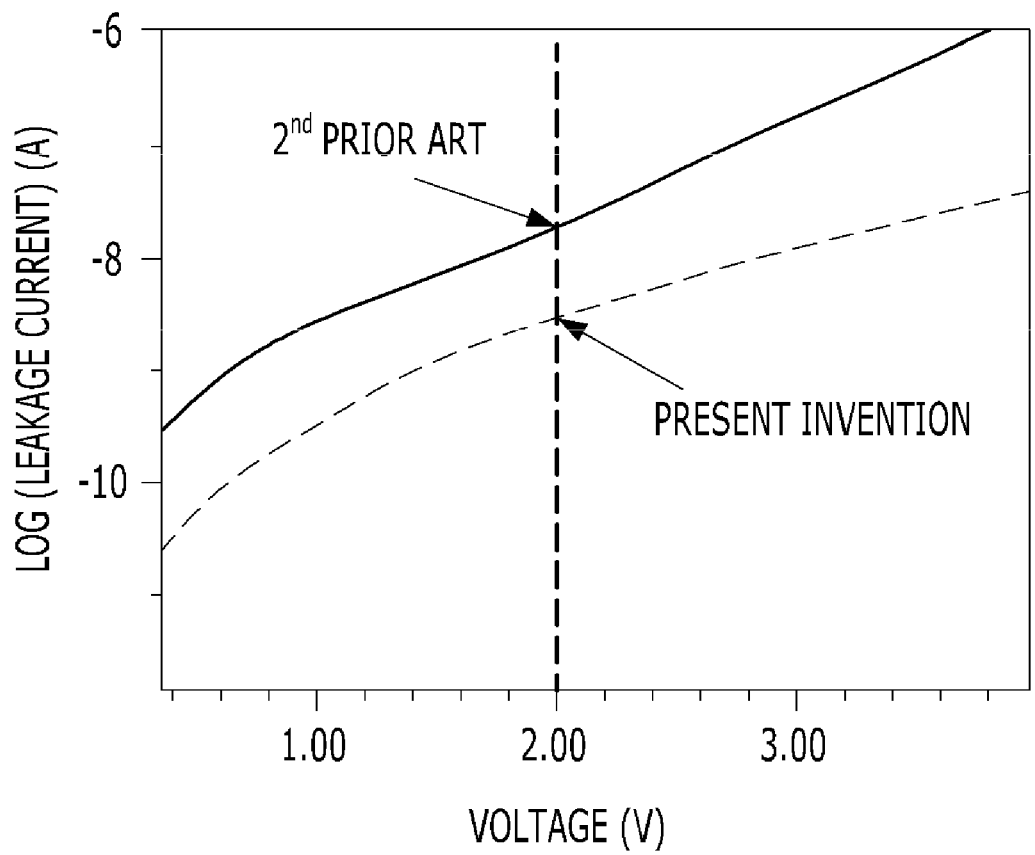
FIG. 5D illustrates a graph comparing leakage current properties of the electrostatic discharge protection device in accordance with the second prior art and the electrostatic discharge protection device in accordance with an embodiment of the present invention.

FIGS. 5A to 5C illustrate simulation images representing leakage current paths of the electrostatic discharge protection devices in accordance with the first and second prior arts and the electrostatic discharge protection device in accordance with the first embodiment of the present invention, respectively. FIG. 5D illustrates a graph comparing leakage current properties of the electrostatic discharge protection device in accordance with the second prior art and the electrostatic discharge protection device in accordance with an embodiment of the present invention. Herein, the simulation representing the leakage current path was performed using technology computer-aided design (TCAD).

Referring to FIGS. 5A to 5D, it is noticed that the contact area of the electrostatic discharge protection device in accordance with the first embodiment of the present invention is greater than that of the electrostatic discharge protection device in accordance with the first prior art from an aspect of the contact area between the active region and the junction region.

Moreover, it is noticed that the leakage current path of the electrostatic discharge protection device in accordance with the first embodiment of the present invention is reduced compared with that of the electrostatic discharge protection device in accordance with the second prior art from an aspect of the leakage current path. Specially, it is verified that the leakage current path due to the impurities piled up on the sidewall of the isolation layer is significantly reduced. In particular, an amount of the leakage current generated in a state that a certain voltage, i.e., 2 V, is supplied to the junction region is 22.7 nA in the second prior art and 2.9 nA in an embodiment of the present invention. Thus, it is noticed that the amount of the leakage current in accordance with the present invention is rapidly reduced compared with that of the second prior art.

That is, in accordance with the present invention, it is possible to prevent the increase of the leakage current and at the same time secure the electrostatic discharge protection property that the highly integrated semiconductor device requires.

Figure 6A:
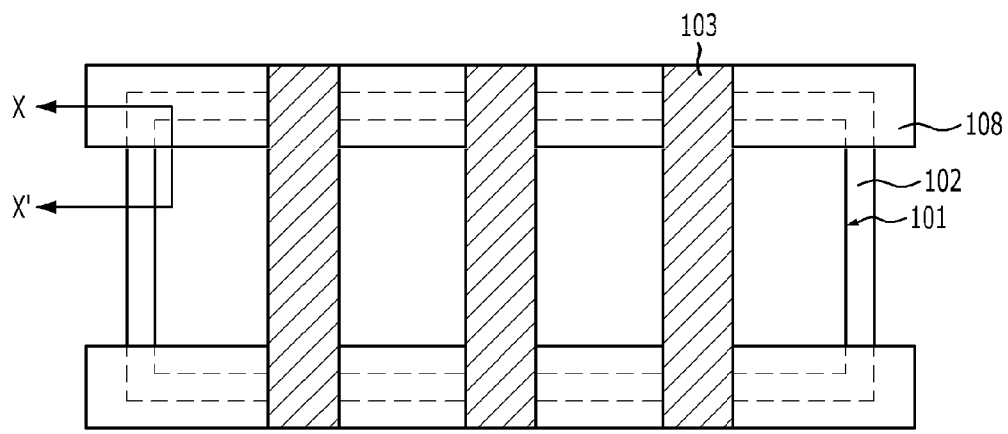
FIGS. 6A to 6C and FIGS. 7A to 7C illustrate flow sheets of a method for fabricating the electrostatic discharge protection device in accordance with the first embodiment of the present invention.
Figure 6B:
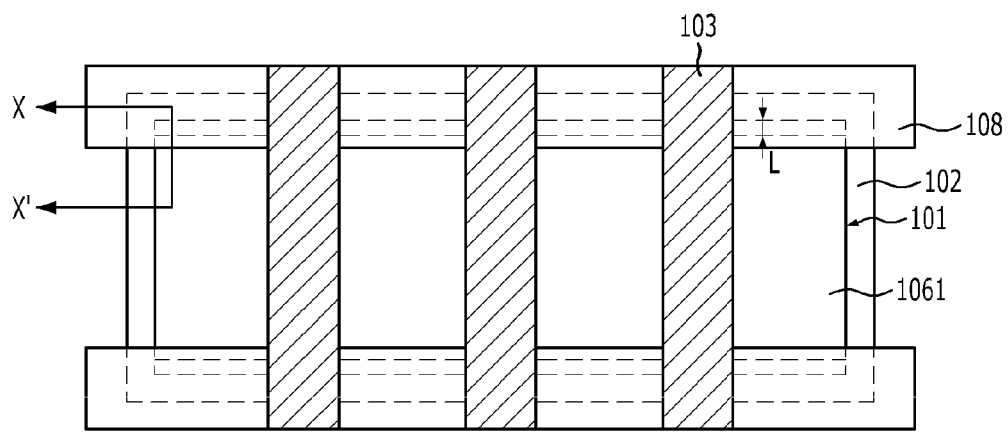
Figure 6C:
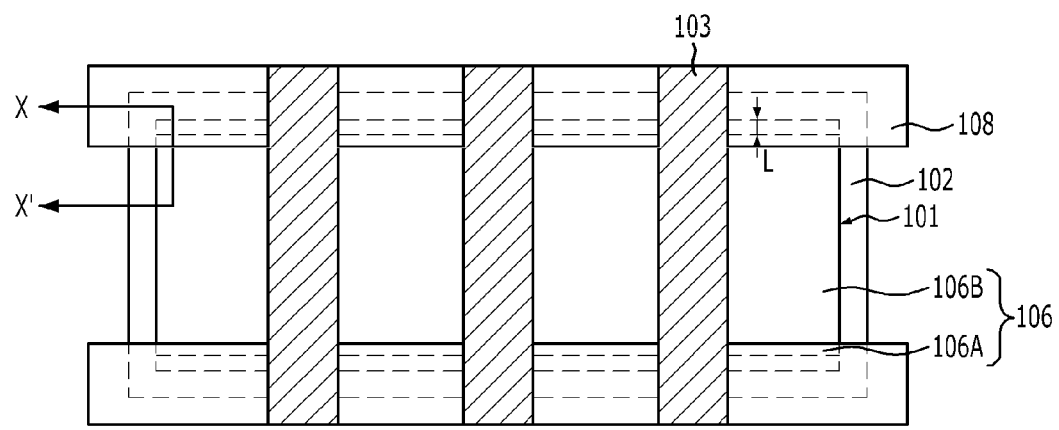
Figure 7A:
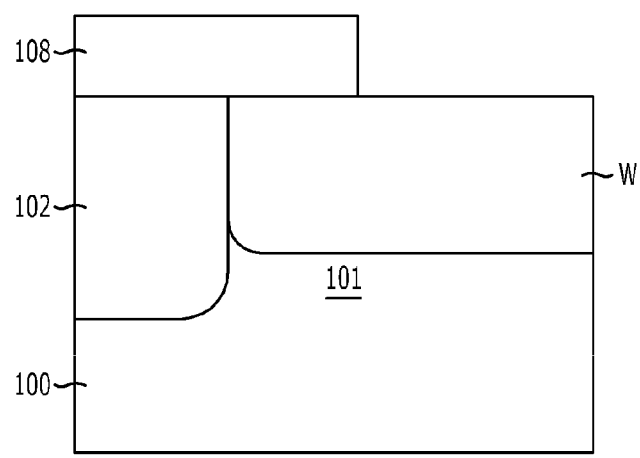
Figure 7B:
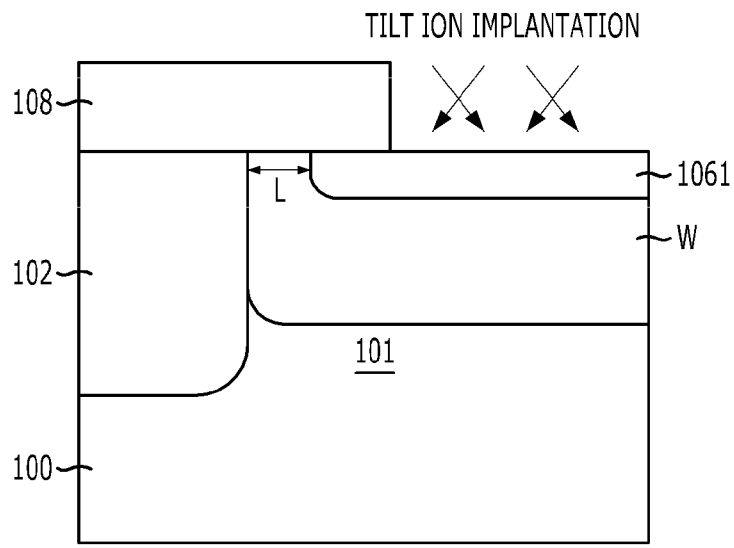
Figure 7C:
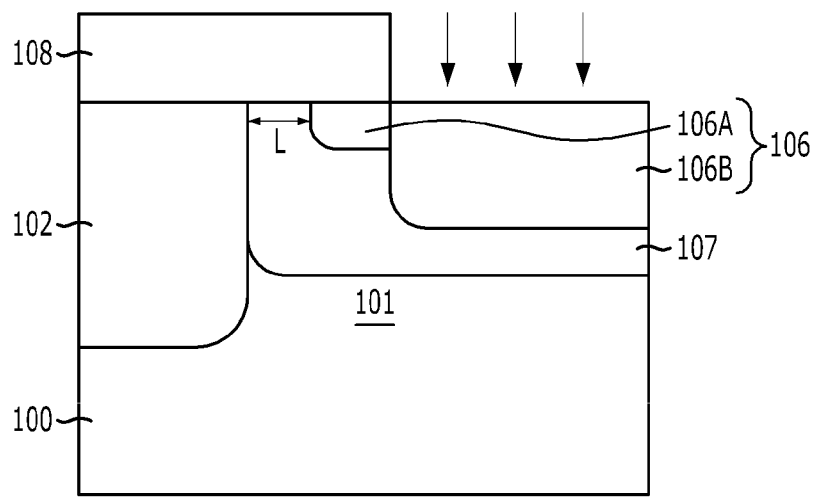

FIGS. 6A to 6C and FIGS. 7A to 7C illustrate flow sheets of a method for fabricating the electrostatic discharge protection device in accordance with the first embodiment of the present invention. Herein, FIGS. 6A to 6C illustrate plane views and FIGS. 7A to 7C illustrate cross-sectional views taken along X-X' lines described in FIGS. 6A to 6C, respectively.

Referring to FIGS. 6A and 7A, the active region 101 is defined by forming the isolation layer 102 having the shallow trench isolation structure in the substrate 100.

Then, a well region W is formed by implanting impurities in the whole active region 101. At this time, the impurities may use P-type impurities such as phosphorus (P) and arsenic (As), or N-type impurities such as boron (B).

Subsequently, the gate electrode 103 simultaneously crossing both of the isolation layer 102 and the active region 101 is formed on the substrate 100. The gate electrode 103 may be formed to be connected to the ground unit (not shown) or the power supplying unit (not shown).

A mask pattern 108 is formed on the substrate 100 to partially cover the active region 101 adjacent to the isolation layer 102 in the direction where the gate electrode 103 is extended. The mask pattern 108 plays a role of separating a junction region from the isolation layer 102 by a certain distance in the direction where the gate electrode 103 is extended as well as acting as an ion implantation barrier in a subsequent process for forming the junction region. The mask pattern 108 may be formed of photoresist (PR).

Then, as shown in FIGS. 6B and 7B, a first junction region 106I is formed by ion-implanting impurities in the well region W within the active region 101 using the mask pattern 108 and the gate electrode 103 as the ion implantation barrier, wherein the first junction region 106I is formed to be separated from the isolation layer 102 by the certain distance L in the direction where the gate electrode 103 is extended. The first junction region 106I may be formed using a tilt ion implantation method and thus the first junction region 106I may be formed in the well region W under the mask pattern 108 by a property of the tilt ion implantation. Herein, although the first junction region 106I is formed to be extended to the well 107 under the mask pattern 108, it is possible to form the first junction region 106I separated from the isolation layer 102 by the certain distance L by adjusting ion implantation energy. For convenience of description, the well region before the first junction region 106I is formed therein and the well region after the first junction region 106I is formed therein may be referred to using the same reference number 'W' in the Figs.

As the first junction region 106I is separated from the isolation layer 102 by the certain distance L by the mask pattern 108, it is possible to prevent the impurities from accumulating on the sidewall of the isolation layer 102 between processes and thus to prevent the increase of the leakage current of the electrostatic discharge protection device.

The first junction region 106I plays a role of reducing the leakage current and adjusting the operating voltage of the electrostatic discharge protection device. At this time, the first junction region 106I may be formed to have the same conductive type as that of the well region W or a conductive type complementary to that of the well region W to thereby enhance the leakage current property and the electrostatic discharge protection property of the electrostatic discharge protection device.

As illustrated in FIGS. 6C and 7C, the second junction part 106B is formed in the first junction region 106I in the direction where the gate electrode 103 is extended by ion-implanting impurities in the well region W within the active region 101 using the mask pattern 108 and the gate electrode 103 as the ion implantation barrier, wherein the second junction part 106B has a junction depth greater than that of the first junction region 106I. At this time, the second junction part 106B is formed to include a portion of the first junction region 106I so that a part of the first junction region 106I remains as the first junction part 106A and have a junction depth greater than that of the first junction part 106A. The well region, after the first junction part and the second junction part are formed, is referred to as well 107. Herein, the second junction part 106B practically acts as a source region and a drain region and may be formed by ion-implanting the impurities in a direction vertical to a surface of the substrate 100.

Through the above processes, the junction region 106 may be formed to include the first and second junction parts 106A and 106B having different junction depths from each other. Like this, it is possible to increase the contact area between the junction region 106 and the active region 101 or the well 107 and thus to secure the electrostatic discharge protection property that the semiconductor device requires by forming the junction region 106 with the first and second junction parts 106A and 106B having different junction depths from each other.

Herein, the second junction part 106B may be formed to have a conductive type complementary to that of the first junction part 106A so as to further improve the electrostatic discharge protection property and the leakage current property of the electrostatic discharge protection device. In this case, it is preferable to form the well 107 to have the same conductive type as that of the first junction part 106A. For instance, in case the conductive type of the first junction part 106A and the well 107 is the P type, the conductive type of the second junction part 106B may be the N type. In case the conductive type of the first junction part 106A and the well 107 is the N type, the conductive type of the second junction part 106B may be the P type. For this purpose, the impurity ion implantation process for forming the second junction part 106B may be performed using a counter doping process.

In the meantime, the second junction part 106B may be formed to have the same conductive type as that of the first junction part 106A so as to further improve the electrostatic discharge protection property and the leakage current property of the electrostatic discharge protection device. In this case, it is preferable that impurity doping concentration of the second junction part 106B is greater than that of the first junction part 106A and the well 107 has a conductive type complementary to that of the first and second junction parts 106A and 106B.

Although it is not shown in FIGS. 6C and 7C, after removing the mask pattern 108, there are formed the first wire 104 connecting the pad unit and the junction region 106 at one side of the gate electrode 103 (e.g., a drain region), and the second wire 105 connecting the ground unit and the junction region 106 at the other side of the gate electrode 103 (e.g., a source region).

The fabrication of the electrostatic discharge protection device in accordance with the present invention can be completed through the above processes. As described above, it is possible to secure the electrostatic discharge protection property that the semiconductor device requires by employing the junction region 106 constructed of the first and second junction parts 106A and 106B having different junction depths from each other, and to prevent the increase of the leakage current of the electrostatic discharge protection device by separating the isolation layer 102 and the junction region 106 by the certain distance L.

Figure 8A:
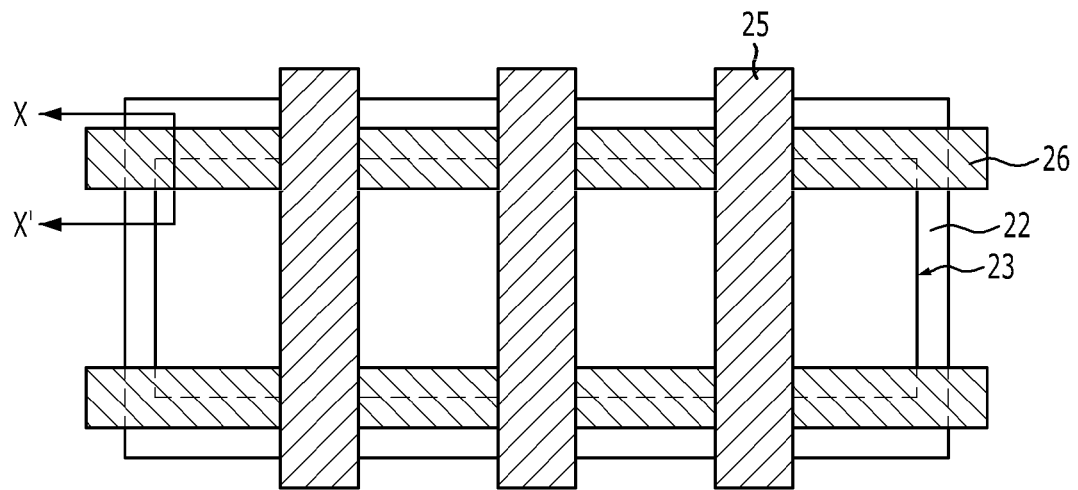
FIGS. 8A to 8C and FIGS. 9A to 9C illustrate flow sheets of a method for fabricating an electrostatic discharge protection device in accordance with a second embodiment of the present invention.
Figure 8B:
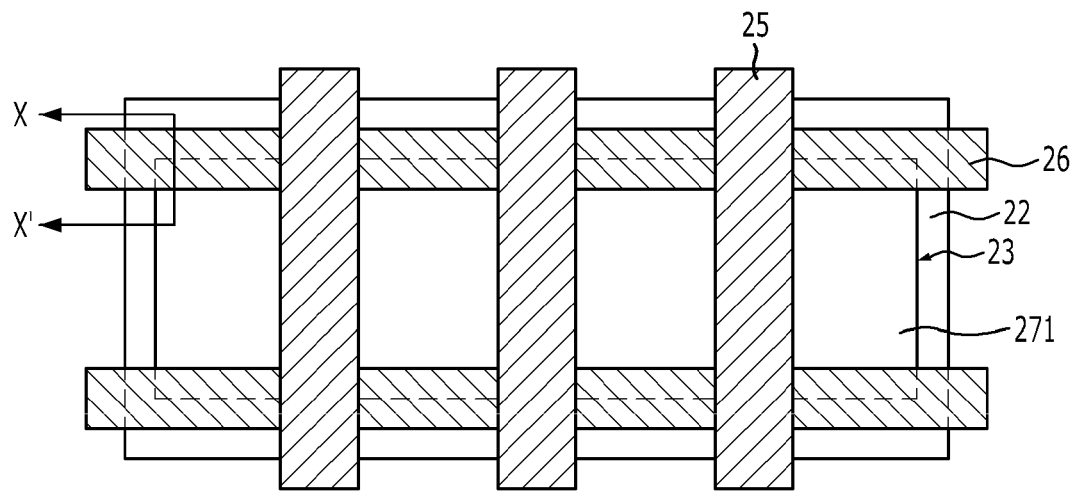
Figure 8C:
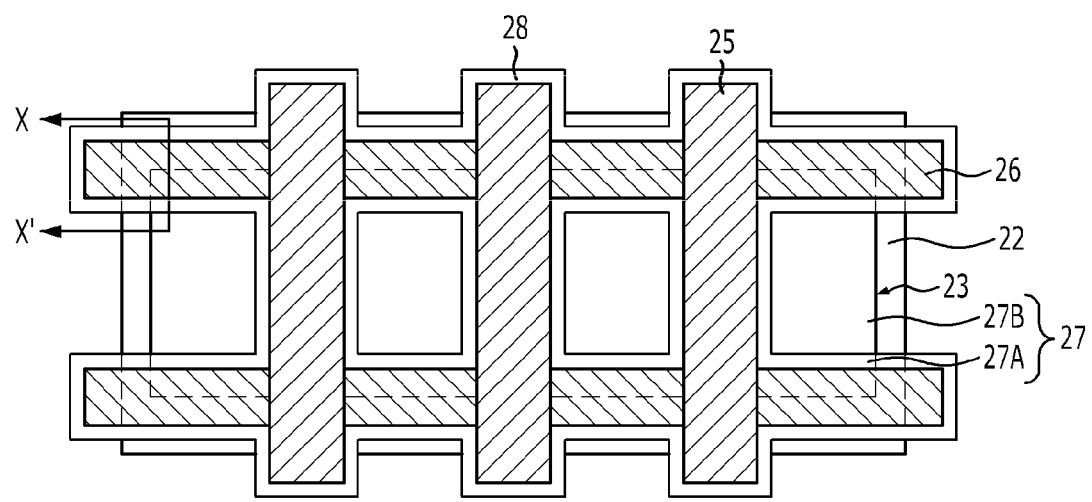
Figure 9A:
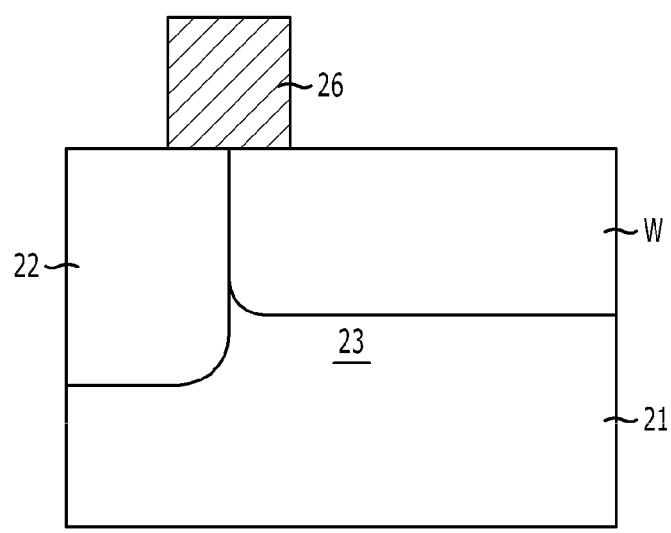
Figure 9B:
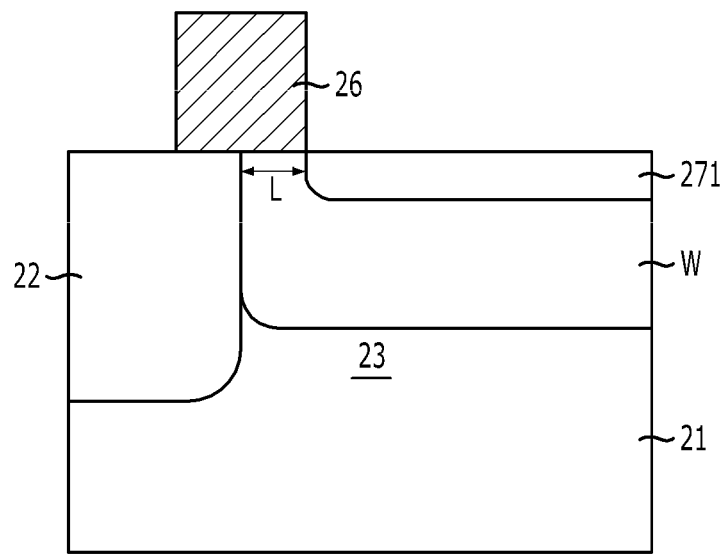
Figure 9C:
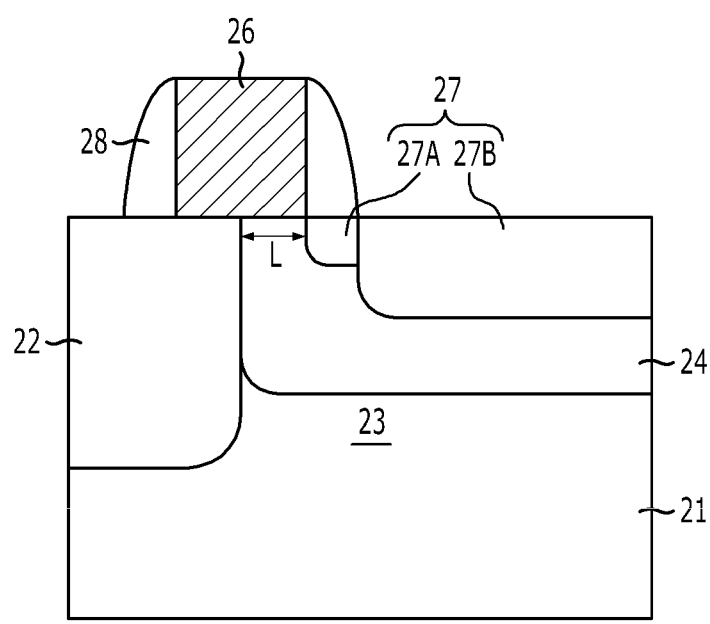

FIGS. 8A to 8C and FIGS. 9A to 9C illustrate flow sheets of a method for fabricating an electrostatic discharge protection device in accordance with a second embodiment of the present invention. Herein, FIGS. 8A to 8C illustrate plane views and FIGS. 9A to 9C illustrate cross-sectional views taken along X-X' lines described in FIGS. 8A to 8C, respectively.

Referring to FIGS. 8A and 9A, an active region 23 is defined by forming an isolation layer 22 having a shallow trench isolation structure in a substrate 21.

Then, a well region W is formed by implanting impurities in the whole active region 23. At this time, the impurities may use P-type impurities such as phosphorus (P) and arsenic (As), or N-type impurities such as boron (B).

Subsequently, a gate electrode 25 simultaneously crossing both of the isolation layer 22 and the active region 23 is formed on the substrate 21. The gate electrode 25 may be formed to be connected to the ground unit (not shown) or the power supplying unit (not shown).

Meanwhile, although it is not shown in the drawings, a gate insulation layer may be formed between the substrate 21 and the gate electrode 25 and a gate hard mask layer may be formed on the gate electrode 25.

Subsequently, a dummy pattern 26 is formed to cover a boundary where the isolation layer 22 is close to the active region 23, especially, a portion of the active region 23 adjacent to the isolation layer 22, in a direction where the dummy pattern 26 crosses the gate electrode 25. The dummy pattern 26 plays a role of separating a junction region from the isolation layer 22 by a certain distance in a direction where the gate electrode 25 is extended, i.e., an X-X' direction, when performing an impurity ion implantation process for forming the junction region.

Herein, the dummy pattern 26 may be formed of various material layers such as a conductive layer, an insulating layer and so on. It is preferable to form the gate electrode 25 and the dummy pattern 26 at the same time to simplify a fabrication process. That is, it is preferable to perform the patterning of the gate electrode 25 and that of the dummy pattern 26 at the same time when executing a patterning process of forming the gate electrode 25 after forming a conductive layer for the gate electrode 25 on the whole surface of the substrate 21.

Referring to FIGS. 8B and 9B, a first junction region 271 is formed in the well region W within the active region 23 by performing the impurity ion implantation process using the gate electrode 25 and the dummy pattern 26 as an ion implantation barrier. At this time, it is possible to form the first junction region 271 separated from the isolation layer 22 by the certain distance L by the dummy pattern 26 in the direction where the gate electrode 25 is extended. Since the first junction region 271 is separated from the isolation layer 22 by the certain distance L by the dummy pattern 26, it is possible to prevent the impurities from being piled up on a sidewall of the isolation layer 22. As a result, the increase of the leakage current of the electrostatic discharge protection device may be prevented. For convenience of description, the well region before the first junction region 271 is formed therein and the well region after the first junction region 271 is formed therein may be referred to using the same reference number 'W' in the Figs.

Herein, the first junction region 271 plays a role of adjusting the operating voltage and reducing the leakage current of the electrostatic discharge protection device. To improve the electrostatic discharge protection property and the leakage current property of the electrostatic discharge protection device, the first junction region 271 may be formed to have the same conductive type as that of the well region W or a conductive type complementary to that of the well region W.

Referring to FIGS. 8C and 9C, a spacer 28 is formed at both sidewalls of the dummy pattern 26 and the gate electrode 25. The spacer 28 may be formed of one selected from a group consisting of an oxide layer, a nitride layer, an oxynitride layer and a stacked layer thereof.

Then, a second junction part 27B is formed in the well region 24 within the active region 23 using the gate electrode 25, the dummy pattern 26 and the spacer 28 as an ion implantation barrier, wherein the second junction part 27B has a junction depth greater than that of the first junction region 271. At this time, the second junction part 27B is formed to include a portion of the first junction region 271 so that a part of the first junction region 271 remains as a first junction part 27A. Further, the second junction part 27B has a junction depth greater than that of the first junction part 27A. The well region, after the first junction part and the second junction part are formed, is referred to as well 24. Herein, the second junction part 27B practically acts as a source region and a drain region. Through the above processes, the junction region 27 may be formed to include the first and second junction parts 27A and 27B having different junction depths from each other. Like this, it is possible to increase a contact area between the junction region 27 and the active region 23 or the well region 24 and thus to secure the electrostatic discharge protection property that the semiconductor device requires by forming the junction region 27 with the first and second junction parts 27A and 27B having different junction depths from each other.

Herein, the second junction part 27B may be formed to have a conductive type complementary to that of the first junction part 27A so as to further improve the electrostatic discharge protection property and the leakage current property of the electrostatic discharge protection device. In this case, it is preferable to form the well region 24 to have the same conductive type as that of the first junction part 27A. For instance, in case the conductive type of the first junction part 27A and the well region 24 is the P type, the conductive type of the second junction part 27B may be the N type. In case the conductive type of the first junction part 27A and the well region 24 is the N type, the conductive type of the second junction part 27B may be the P type. For this purpose, the impurity ion implantation process for forming the second junction part 27B may be performed using the counter doping process.

Meanwhile, the second junction part 27B may be formed to have the same conductive type as that of the first junction part 27A so as to further improve the electrostatic discharge protection property and the leakage current property of the electrostatic discharge protection device. In this case, it is preferable that impurity doping concentration of the second junction part 27B is greater than that of the first junction part 27A and the well region 24 has a conductive type complementary to that of the first and second junction parts 27A and 27B.

Then, although it is not shown in FIGS. 8C and 9C, there are formed a first wire connecting a pad unit and the junction region 27 at one side of the gate electrode 25 (e.g., a drain region), and a second wire connecting the ground unit and the junction region 27 at the other side of the gate electrode 25 (e.g., a source region).

The electrostatic discharge protection device in accordance with the second embodiment of the present invention can be fabricated through the above processes. As described above, it is possible to secure the electrostatic discharge protection property that the semiconductor device requires by employing the junction region 27 constructed of the first and second junction parts 27A and 27B having different junction depths from each other, and to prevent the increase of the leakage current of the electrostatic discharge protection device by separating the isolation layer 22 and the junction region 27 by the certain distance L in the direction where the gate electrode 25 is extended.

In accordance with the embodiments of the present invention, it is possible to prevent the increase of the leakage current of the electrostatic discharge protection device at the same time of securing the electrostatic discharge protection property that the semiconductor device requires by separating the junction region from the isolation layer by the certain distance in the direction where the gate electrode is extended.

Furthermore, in accordance with the embodiments of the present invention, there is an effect of effectively preventing the increase of the leakage current of the electrostatic discharge protection device and at the same time securing the electrostatic discharge protection property that the semiconductor device requires by separating the junction region from the isolation layer by the certain distance and constructing the junction region with the first and second junction parts.

While the disclosure above has been described with respect to the specific embodiments, it will be apparent to those skilled in the art that various changes and modifications may be made without departing from the spirit and scope of the invention as defined in the following claims.

What is claimed is:

1. An electrostatic discharge protection device, comprising:
    a substrate where an active region is defined by an isolation layer;
    a gate electrode simultaneously crossing both the isolation layer and the active region; and
    a junction region formed in the active region at both sides of the gate electrode and separated from the isolation layer by a certain distance in a first direction where the gate electrode is extended, wherein the junction region comprises first and second junction parts stacked in the first direction.

2. The electrostatic discharge protection device of claim 1, wherein the first and second junction parts have different junction depths from each other in a second direction orthogonal to the first direction.

3. The electrostatic discharge protection device of claim 1, wherein the first junction part has a junction depth smaller than that of the second junction part in a second direction orthogonal to the first direction, and is disposed at both sides of the second junction part and separated from the isolation layer by the certain distance in the first direction.

4. The electrostatic discharge protection device of claim 2, wherein the first and second junction parts have the same conductive type or conductive types complementary to each other.

5. The electrostatic discharge protection device of claim 4, wherein, the first and second junction parts have the same conductive type, and the impurity doping concentration of the first junction part is smaller than that of the second junction part.

6. The electrostatic discharge protection device of claim 4, further comprising a well formed in the active region and including the first and second junction parts therein.

7. The electrostatic discharge protection device of claim 6, wherein, the first and second junction parts have the same conductive type, and the well has a conductive type complementary to that of the first and second junction parts.

8. The electrostatic discharge protection device of claim 6, wherein, the first and second junction parts have conductive types complementary to each other, and the well has the same conductive type as that of the first junction part.

9. The electrostatic discharge protection device of claim 1, wherein the first and second junction parts have different widths from each other in the first direction.

10. The electrostatic discharge protection device of claim 1, wherein the first junction part has a first side apart from the isolation layer by the certain distance, and a second side contacting with the second junction part in the first direction.

* * * * *